United States Patent
Jin et al.

(10) Patent No.: US 8,294,880 B2
(45) Date of Patent: Oct. 23, 2012

(54) DISTANCE MEASURING SENSOR INCLUDING DOUBLE TRANSFER GATE AND THREE DIMENSIONAL COLOR IMAGE SENSOR INCLUDING THE DISTANCE MEASURING SENSOR

(75) Inventors: Young-gu Jin, Hwaseong-si (KR); Dae-kil Cha, Seoul (KR); Seung-hoon Lee, Seoul (KR); Yoon-dong Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/137,907

(22) Filed: Sep. 21, 2011

(65) Prior Publication Data

US 2012/0012899 A1 Jan. 19, 2012

Related U.S. Application Data

(63) Continuation of application No. 12/379,021, filed on Feb. 11, 2009, now Pat. No. 8,035,806.

(30) Foreign Application Priority Data

May 13, 2008 (KR) .................. 10-2008-0044021
Jul. 8, 2008 (KR) .................. 10-2008-0066224

(51) Int. Cl.
*G01C 3/08* (2006.01)

(52) U.S. Cl. ...... 356/4.01; 356/3.01; 356/4.1; 356/5.01; 356/5.1

(58) Field of Classification Search ........ 356/3.01–3.15, 356/4.01–4.1, 5.01–5.15, 6–22, 28, 28.5
See application file for complete search history.

(56) References Cited

U.S. PATENT DOCUMENTS 6,396,570 B2  5/2002 Takayanagi et al.
2006/0128087 A1 *  6/2006 Bamji et al. ................. 438/199
* cited by examiner

*Primary Examiner* — Luke Ratcliffe
(74) *Attorney, Agent, or Firm* — Harness, Dickey & Pierce, P.L.C.

(57) ABSTRACT

Provided are a distance measuring sensor including a double transfer gate, and a three dimensional color image sensor including the distance measuring sensor. The distance measuring sensor may include first and second charge storage regions which are spaced apart from each other on a substrate doped with a first impurity, the first and second charge storage regions being doped with a second impurity; a photoelectric conversion region between the first and second charge storage regions on the substrate, being doped with the second impurity, and generating photo-charges by receiving light; and first and second transfer gates which are formed between the photoelectric conversion region and the first and second charge storage regions above the substrate to selectively transfer the photo-charges in the photoelectric conversion region to the first and second charge storage regions.

17 Claims, 7 Drawing Sheets

DISTANCE MEASURING SENSOR INCLUDING DOUBLE TRANSFER GATE AND THREE DIMENSIONAL COLOR IMAGE SENSOR INCLUDING THE DISTANCE MEASURING SENSOR

PRIORITY STATEMENT

This application is a continuation of and claims priority under 35 U.S.C. §§120/121 to U.S. patent application Ser. No. 12/379,021 filed on Feb. 11, 2009 now U.S. Pat. No. 8,035,806, which claims priority under 35 U.S.C. §119 to Korean Patent Applications Nos. 10-2008-0044021 and 10-2008-0066224, filed on May 13, 2008 and Jul. 8, 2008, respectively, in the Korean Intellectual Property Office (KIPO). The disclosures of each of the above applications are incorporated herein by reference.

BACKGROUND

1. Field

Example embodiments relates to a distance measuring sensor including a double transfer gate, and a three dimensional color image sensor including the distance measuring sensor.

2. Description of the Related Art

Photogate depth sensors may measure a distance to an object by detecting reflected light from the object. The photogate depth sensors may irradiate light onto an object, measure a delay time by measuring light reflected from the object, and calculate a distance from the object according to the measured delay time.

Color image sensors are photoelectric conversion devices that may convert light into an electric signal. Conventional image sensors may include a plurality of unit pixels arranged in a matrix on a semiconductor substrate. Each unit pixel may include a photodiode and transistors. The photodiode may generate and store a photo-charge by detecting light from the outside, and the transistors may output an electric signal according to the charge amount of the generated photo-charge.

Complementary metal oxide semiconductor (CMOS) image sensors may include a photodiode that receives and stores an optical signal, and realizes an image by using a control device that controls or processes the optical signal. Since the control device may be manufactured by using a CMOS manufacturing technology, the CMOS image sensors may have simple manufacturing processes, and moreover, may be manufactured as one chip including the control device and the photodiode.

Three dimensional color image sensors may realize a three dimensional color image of an object by measuring colors of the object and a distance to the object.

A conventional distance measuring sensor may include a double photogate on a light incidence surface, and thus the light amount may be reduced while passing through the double photogate or a light sensing region may be reduced due to the double photogate, thereby reducing a distance measuring sensitivity. Also, the material of the double photogate may be limited to polysilicon, which is a light-transmissive material.

SUMMARY OF THE INVENTION

Example embodiments provide a distance measuring sensor which may include a photoelectric conversion region formed on a substrate and a double transfer gate formed above the substrate, thereby improving light sensing sensitivity.

Example embodiments also provide a three dimensional color image sensor in which the distance measuring sensor and a color image sensor may be combined.

According to example embodiments, a distance measuring sensor may include: first and second charge storage regions which are spaced apart from each other on a substrate doped with a first impurity, the first and second charge storage regions being doped with a second impurity; a photoelectric conversion region between the first and second charge storage regions on the substrate, the photoelectric conversion region being doped with the second impurity, and generating photo-charges by receiving light; and first and second transfer gates which are formed between the photoelectric conversion region and the first and second charge storage regions above the substrate to selectively transfer the photo-charges in the photoelectric conversion region to the first and second charge storage regions.

The photoelectric conversion region may be an intrinsic region.

A density of the second impurity in the photoelectric conversion region may be lower than a density of the second impurity in the first and second charge storage regions.

The photoelectric conversion region may be formed at a predetermined or reference depth from a top surface of the substrate.

An intrinsic region may be further formed below the photoelectric conversion region.

The first and second transfer gates may be formed of polysilicon or a metal.

Both ends of the first and second transfer gates may be extended to face each other to enclose a portion of the photoelectric conversion.

The first and second charge storage regions may be floating diffusion regions, and form transfer transistors with the photoelectric conversion region and the first and second transfer gates.

Example embodiments provided a three dimensional color image sensor which may include a plurality of unit pixels, each unit pixel comprising a plurality of color pixels and a distance measuring sensor, wherein the distance measuring sensor may include first and second charge storage regions which are spaced apart from each other on a substrate doped with a first impurity, the first and second charge storage regions being doped with a second impurity; a photoelectric conversion region between the first and second charge storage regions on the substrate, the photoelectric conversion region being doped with the second impurity, and generating photo-charges by receiving light; and first and second transfer gates which are formed between the photoelectric conversion region and the first and second charge storage regions above the substrate to selectively transfer the photo-charges in the photoelectric conversion region to the first and second charge storage regions.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF THE INVENTION

Figure 1:
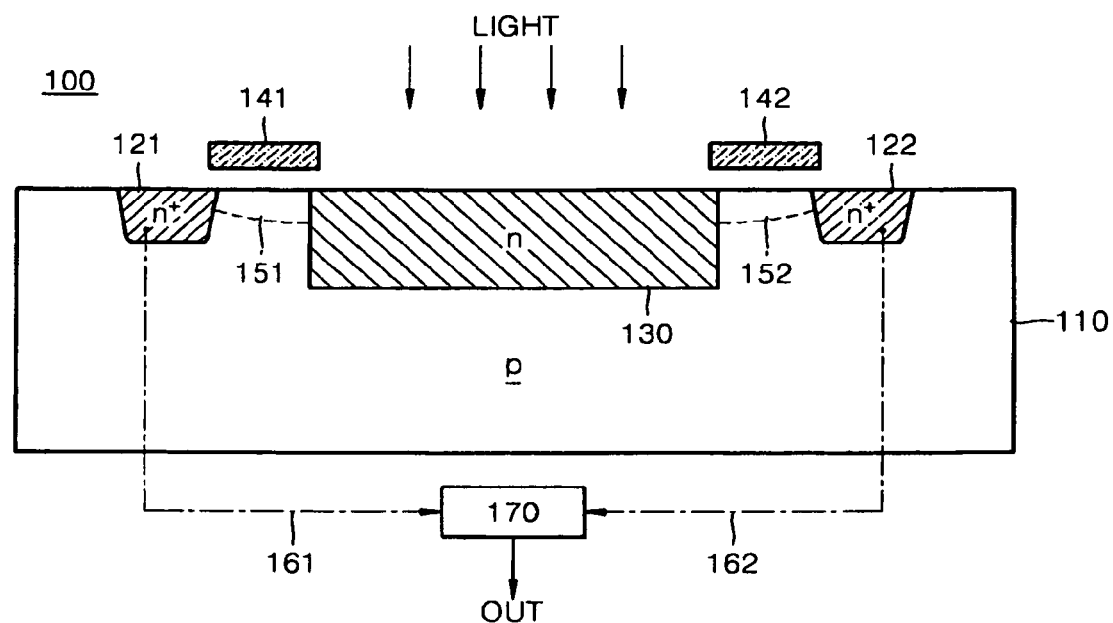
FIG. 1 is a diagram illustrating a distance measuring sensor including a double transfer gate, according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise.

It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a diagram illustrating a distance measuring sensor 100 including a double transfer gate, according to example embodiments.

Referring to FIG. 1, the distance measuring sensor 100 may include two transfer gates 141 and 142 on a substrate 110. First and second charge storage regions 121 and 122, which may be n+ doped regions, may be spaced apart from each other on a p-type substrate 110. A photoelectric conversion region 130 may be formed between the first and second charge storage regions 121 and 122. The photoelectric conversion region 130 may be an n doped region with a lower impurity density than that of the first and second charge storage regions 121 and 122, or an intrinsic region.

First and second transfer gates 141 and 142 may be formed above the p-type substrate 110, respectively between the photoelectric conversion region 130 and the first charge storage region 121, and between the photoelectric conversion region 130 and the second charge storage region 122. The photoelectric conversion region 130 may generate photo-charges by receiving light. An infrared filter and a micro lens, which are not shown for convenience, may be further installed above the p-type substrate. In addition, a dielectric layer (not shown) may be formed between the first and second transfer gates 141 and 142 and the p-type substrate 110.

The first and second charge storage regions 121 and 122 are regions where electrons from electron-hole pairs generated in the photoelectric conversion region 130 may accumulate. When a voltage, for example, a positive voltage of 2~3 V, is applied to the first or second transfer gate 141 or 142, n region 151 or 152 may be formed below the first or second transfer gate 141 or 142 where the voltage is applied. Accordingly, the electrons may be transferred and stored in the first or second charge storage region 121 or 122 along the n region 151 or 152. A first signal circuit 161 and a second signal circuit 162 may be respectively connected to the first and second charge storage regions 121 and 122, and respectively read first and second signals from the corresponding accumulated photo-charges. The first and second signals respectively read by the first and second signal circuits 161 and 162 may be transmitted to a circuit processor 170 that can measure a distance to an object by using a delay time between the first and second signals. A method of measuring the distance by using the first and second signals may vary, and details thereof will be described later.

The p-type substrate 110 may be a silicon substrate, and the first and second transfer gates 141 and 142 may be formed of polysilicon or a metal.

Figure 2:
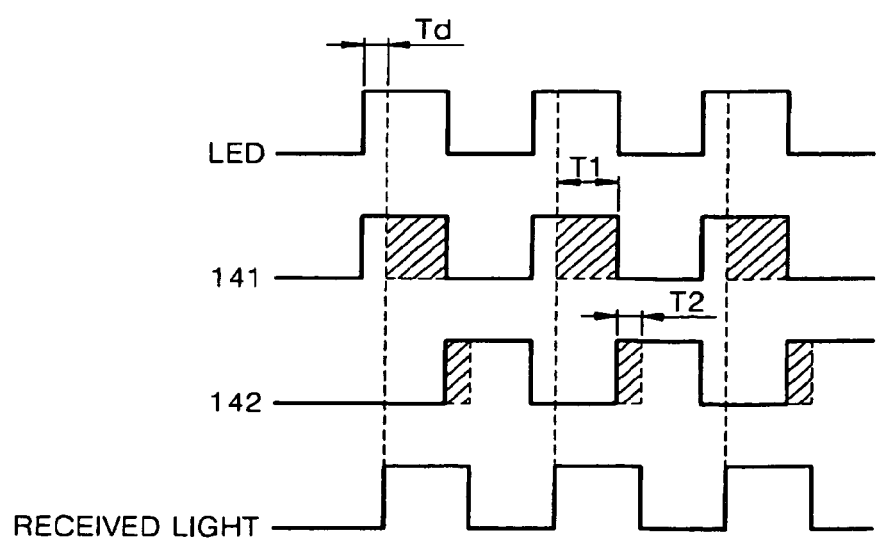
FIG. 2 is a timing diagram for describing an operation of a distance measuring sensor including a double transfer gate, according to example embodiments.

FIG. 2 is a timing diagram for describing an operation of the distance measuring sensor 100 including a double transfer gate, according to example embodiments. Hereinafter, operations of the distance measuring sensor 100 will be described in detail with reference to FIGS. 1 and 2.

According to the example illustrated in FIG. 2, first, a light emitting device (LED) that is disposed on the distance measuring sensor 100 may irradiate infrared light on an object. The light emitting device may emit a pulse optical signal according to a pulse voltage. Here, a first pulse voltage synchronized with the pulse optical signal may be applied to the first transfer gate 141, and a second pulse voltage having a predetermined or reference phase difference with the pulse optical signal may be applied to the second transfer gate 142. The phase difference may be 180°.

The infrared light from the light emitting device LED may be incident on the object at a predetermined or reference distance, and the infrared light reflected from the object may be incident on the distance measuring sensor 100. The infrared light may be incident on the distance measuring sensor 100 by being delayed according to a distance of the object from the distance measuring sensor 100. In FIG. 2, the infrared light incident on the first and second transfer gates 141 and 142 may be detected in a pulse form having a delay time Td compared to the pulse signal of the first transfer gate 141. The measured distance of the object may be shorter when a difference (T1−T2) between a time T1, wherein the pulse signal of the infrared light and the pulse signal of the first transfer gate 141 overlap, and a time T2, wherein the pulse signal of the infrared light and the pulse signal of the second transfer gate 142 overlap, increases.

When the positive voltage of 2~3 V is applied to the first transfer gate 141, the neighboring region of the first transfer gate 141 may become an inversion region 151, and thus the electric charge generated in the photoelectric conversion region 130 may be transferred to the first charge storage region 121 along the inverted n region 151. The electric charge gathered in the first charge storage region 121 may be inputted to the circuit processor 170 as the first signal, via the first signal circuit 161.

When the pulse voltage having the phase difference of 180° with the pulse voltage of the first transfer gate 141 is applied to the second transfer gate 142, the neighboring region of the second transfer gate 142 may become an inversion region 152, and may become a migrating path of the electric charge. Accordingly, the electric charge may be transferred to the second charge storage region 122 along the n region 152. The electric charge gathered in the second charge storage region 122 may be inputted to the circuit processor 170 as the second signal, via the second signal circuit 162. The circuit processor 170 may determine the distance between the object and the distance measuring sensor 100 by using the delay time between the first and second signals.

According to the distance measuring sensor 100, since the photoelectric conversion region 130 receives the light without being affected by the first and second transfer gates 141 and 142, the sensitivity of the distance measuring sensor 100 may be improved according to the area of the photoelectric conversion region 130. Also, since the photoelectric conversion region 130 is not affected in light reception by the first and second transfer gates 141 and 142, a metal having low light transmission may be used to manufacture the first and second transfer gates 141 and 142.

Figure 3:
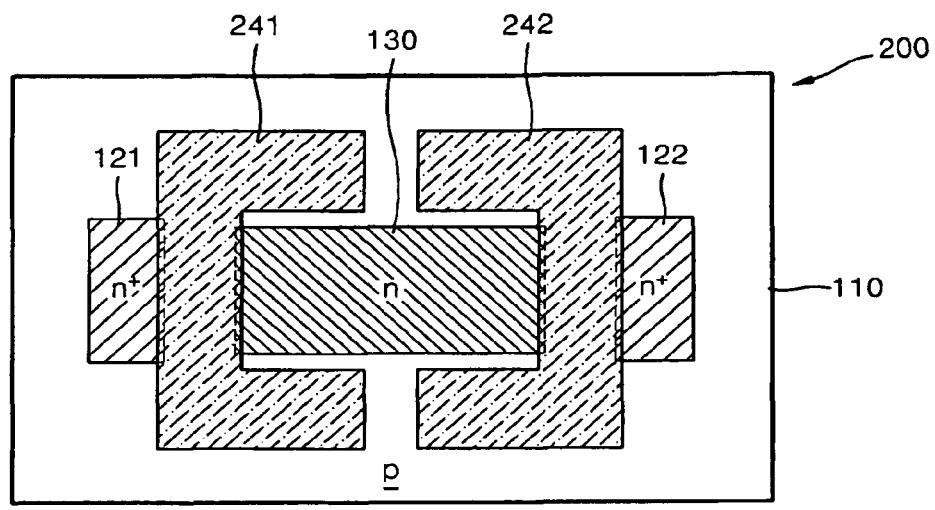
FIG. 3 is a plan view of a distance measuring sensor including a double transfer gate, according to example embodiments.

FIG. 3 is a plan view of a distance measuring sensor 200 including a double transfer gate, according to example embodiments. Elements of the distance measuring sensor 200 that are identical to those of the distance measuring sensor 100 have the same reference numerals, and detailed descriptions thereof will be omitted here.

Referring to FIG. 3, both ends of first and second transfer gates 241 and 242 disposed above the p-type substrate 110 may be extended toward each other. In other words, the first and second transfer gates 241 and 242 have a horseshoe shape. In FIG. 3, the first and second transfer gates 241 and 242 may be formed to enclose the photoelectric conversion region 130, and thus path through which electrons migrate from the photoelectric conversion region 130 to inversion regions (refer to 151 and 152 in FIG. 2) under the first and second transfer gates 241 and 242 may decrease. Accordingly, the electric charge in the photoelectric conversion region 130 may migrate to the first or second charge storage region 121 or 122 faster.

The operations of the distance measuring sensor 200 of FIG. 3 may be identical to the operations of the distance measuring sensor 100 of FIG. 1, and thus details thereof will be omitted here.

Figure 4:
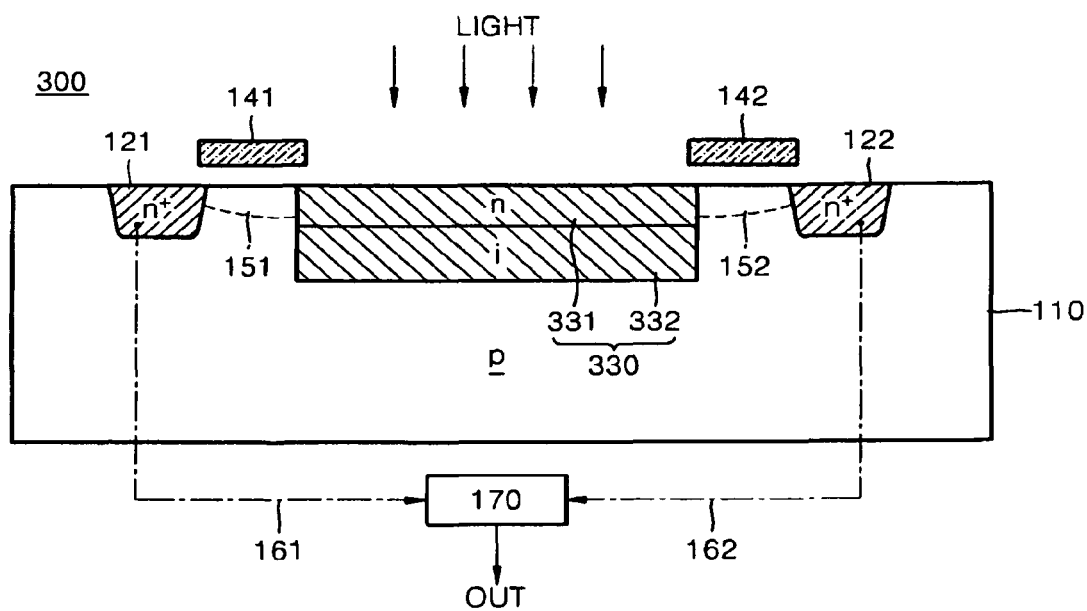
FIG. 4 is a diagram illustrating a distance measuring sensor including a double transfer gate, according to example embodiments.

FIG. 4 is a diagram illustrating a distance measuring sensor 300 including a double transfer gate, according to example embodiments. Elements of the distance measuring sensor 300 that are identical to the elements of the distance measuring sensor 100 of FIG. 1 have the same reference numerals, and details thereof will be omitted here.

Referring to FIG. 4, a photoelectric conversion region 330 of the distance measuring sensor 300 may include an n doped layer 331 formed on the surface of the p-type substrate 110 and an intrinsic layer 332 formed below the n doped layer 331. The n doped layer 331, the intrinsic layer 332, and the p-type substrate 110 may form a p-i-n junction structure. The photoelectric conversion region 330 may have higher light receiving efficiency.

Other operations of the distance measuring sensor 300 may be identical to the distance measuring sensor 100, and thus details thereof will be omitted here.

Figure 5:
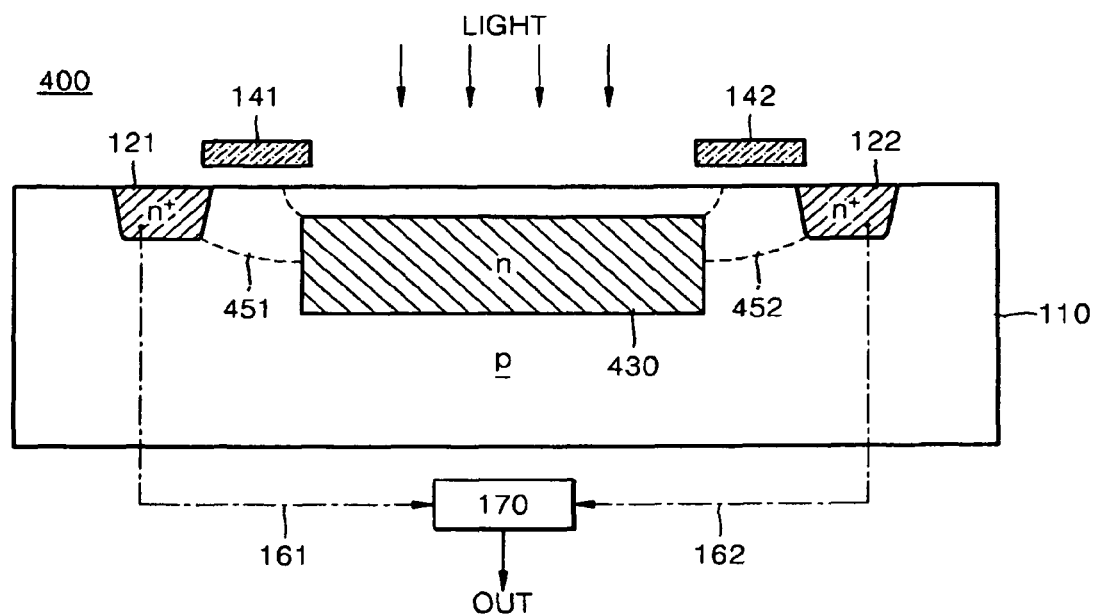
FIG. 5 is a diagram illustrating a distance measuring sensor including a double transfer gate, according to example embodiments.

FIG. 5 is a diagram illustrating a distance measuring sensor 400 including a double transfer gate, according to example embodiments. Elements of the distance measuring sensor 400 that are identical to the elements of the distance measuring sensor 100 of FIG. 1 have the same reference numerals, and details thereof are omitted.

Referring to FIG. 5, the distance measuring sensor 400 may include a photoelectric conversion region 430 formed at a predetermined or reference depth, for example, at least several tens of nanometers, from the surface of the p-type substrate 110. The photoelectric conversion region 430 may be formed by performing an implantation process with an n-type impurity. When a predetermined or reference positive voltage is applied to the first and second transfer gates 141 and 142, inversion regions 451 and 452, which may be in an electric charge migrating path, may be formed between the photoelectric conversion region 430 and the first and second charge storage regions 121 and 122.

In the distance measuring sensor 400, since the photoelectric conversion region 430 is below the surface of the p-type substrate 110, noise due to accumulated electric charge may be prevented by suppressing electron-hole recombination and emission of charge due to a defect on the surface of the p-type substrate 110.

An intrinsic layer (refer to 332 in FIG. 4) may be further formed below the photoelectric conversion region 430. Alternatively, the photoelectric conversion region 430 may be an intrinsic layer itself.

Other operations of the distance measuring sensor 400 may be identical to the operations of the distance measuring sensor 100, and thus details thereof will be omitted here.

Figure 6:
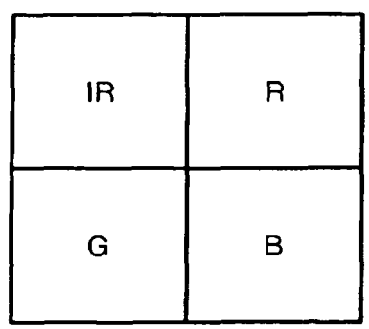
FIG. 6 is a plan view of a three dimensional color image sensor, according to example embodiments.

FIG. 6 is a plan view of a three dimensional color image sensor, according to example embodiments.

Referring to FIG. 6, the three dimensional color image sensor may include a plurality of unit pixels arranged in an array form. Each unit pixel may include an infrared pixel IR and color pixels for a color image, for example a red pixel R, a green pixel G, and a blue pixel B. The infrared pixel IR may correspond to the distance measuring sensors 100, 200, 300, and 400.

Figure 7:
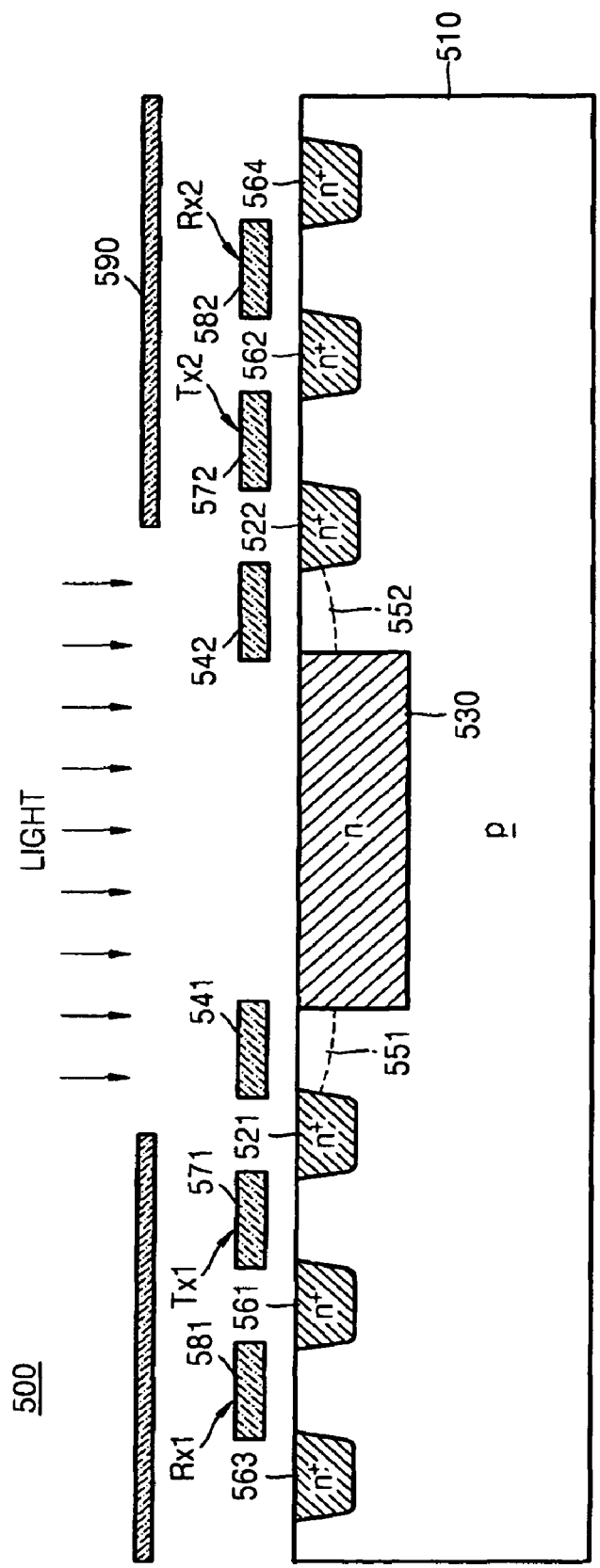
FIG. 7 is a diagram illustrating a sub-pixel of a unit pixel according to example embodiments.

FIG. 7 is a diagram illustrating a sub-pixel 500 of a unit pixel according to example embodiments. The sub-pixel 500 may be one of a red pixel, a green pixel, a blue pixel, and an infrared pixel. A filter (not shown) corresponding to each sub-pixel 500 may be formed on each sub-pixel 500, and a micro lens (not shown) may be formed on each filter.

Referring to FIG. 7, the sub-pixel 500 may include first and second charge storage regions 521 and 522, which may be n+ doped regions, spaced apart from each other on a p-type substrate 510. A photoelectric conversion region 530 may be formed between the first and second charge storage regions 521 and 522. The photoelectric conversion region 530 may be an n-doped region or an intrinsic region.

First and second transfer gates 541 and 542 may be formed above the p-type substrate 510, respectively between the photoelectric conversion region 530 and the first charge storage region 521, and between the photoelectric conversion region 530 and the second charge storage region 522. In other words, a double transfer gate may be formed in one sub-pixel region of the p-type substrate 510.

The photoelectric conversion region 530 may receive light and generate photo-charges.

The first and second charge storage regions 521 and 522 may accumulate electrons from electron-hole pairs formed in the photoelectric conversion region 530. When a voltage, for example a positive voltage of 2-3 V, is applied to the first or second transfer gate 541 or 542, n region 551 or 552 may be formed respectively under the first or second transfer gate 541 or 542. Accordingly, the electrons may migrate to and be stored in the first or second charge storage region 521 or 522 through the n region 551 or 552.

The n+ regions may be formed on the p-type substrate 510, in a direction away from the first and second charge storage regions 521 and 522. The n+ regions may be floating diffusion regions 561 and 562, and reset diffusion regions 563 and 564. Regions that form a drive transistor and a selection transistor are not illustrated in FIG. 7.

Transfer gates 571 and 572 may be formed respectively between the first charge storage region 521 and the floating diffusion region 561, and the second charge storage region 522 and the floating diffusion region 562. Reset gates 581 and 582 may be formed respectively between the floating diffusion region 561 and the reset diffusion region 563, and the floating diffusion region 562 and the reset diffusion region 564. The first and second charge storage regions 521 and 522, the floating diffusion regions 561 and 562, and the transfer gates 571 and 572 may form transfer transistors Tx1 and Tx2. Also, the floating diffusion regions 561 and 562, the reset diffusion regions 563 and 564, and the reset gates 581 and 582 may form reset transistors Rx1 and Rx2.

A light shield 590 may be formed of a metal or a black material, and may prevent noise from being generated when light is irradiated onto a region other than the photoelectric conversion region 530.

Figure 8:
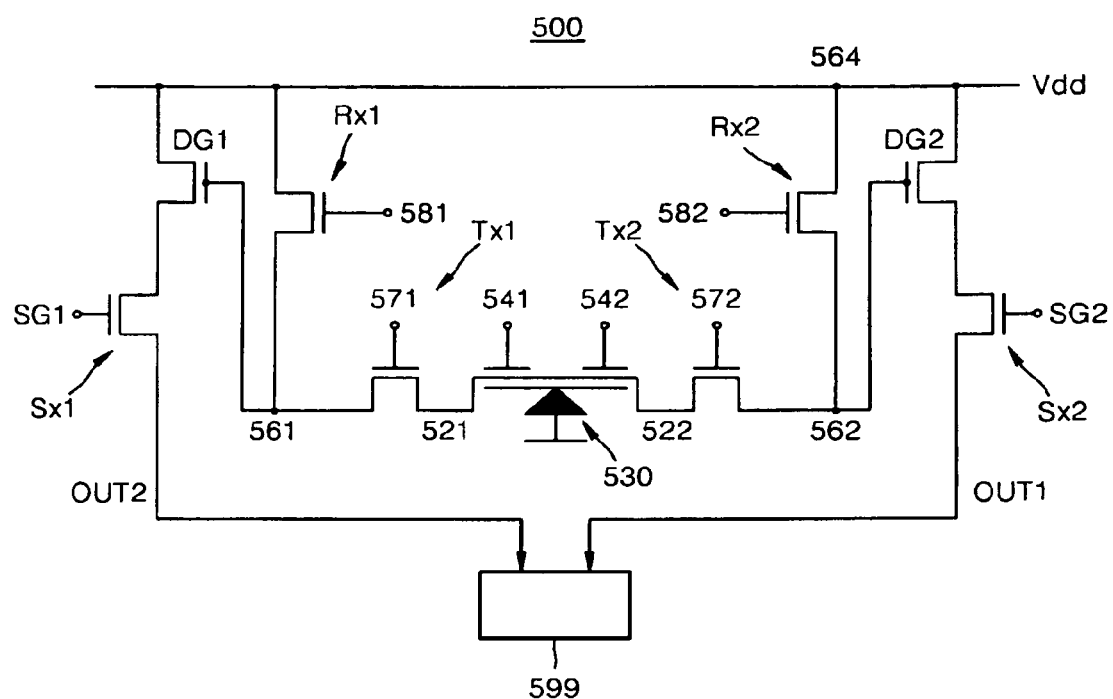
FIG. 8 is a circuit diagram of a sub-pixel of a three dimensional color image sensor, according to example embodiments.

FIG. 8 is a circuit diagram of a sub-pixel of a three dimensional color image sensor, according to example embodiments.

Referring to FIGS. 7 and 8, the first and second transfer gates 541 and 542 may be formed on the photoelectric conversion region 530, and each of the first and second transfer gates 541 and 542 may be connected to the transfer transistors Tx1 and Tx2, the reset transistors Rx1 and Rx2, drive transistors Dx1 and Dx2, and selection transistors Sx1 and Sx2.

Values of outputs OUT1 and OUT2 from the selection transistors Sx1 and Sx2 may be inputted to a circuit processor 599.

The transfer transistors Tx1 and Tx2 may transfer electrons of the first and second charge storage regions 521 and 522 to the floating diffusion regions 561 and 562 when a predetermined or reference voltage is applied to the first and second transfer gates 541 and 542. The reset transistors Rx1 and Rx2 may reset electric potential of the floating diffusion regions 561 and 562 to an input power source voltage Vdd by applying voltage to the reset gates 581 and 582. The drive transistors Dx1 and Dx2 may perform functions of a source follower amplifier. The selection transistors Sx1 and Sx2 may be switching devices for selecting a unit pixel by selection gates SG1 and SG2. The input power source voltage Vdd may be output to the outputs OUT1 and OUT2 via the drive transistors Dx1 and Dx2, and the selection transistors Sx1 and Sx2.

The p-type substrate 510 may be a silicon substrate, and the first and second transfer gates 541 and 542 may be formed of polysilicon or a metal.

When the sub-pixel 500 is an infrared pixel, pulse voltages having different phases may be input to the first and second transfer gates 541 and 542. Also, the circuit processor 599 may calculate a time delay between the outputs OUT1 and OUT2.

Also when the sub-pixel 500 is an infrared pixel, the transfer transistors Tx1 and Tx2, the reset transistors Rx1 and Rx2, the drive transistors Dx1 and Dx2, and the selection transistors Sx1 and Sx2 may be the first and second signal circuits 161 and 162 of FIG. 1.

Meanwhile, when the sub-pixel is a color pixel, a voltage may be simultaneously applied to the first and second transfer gates 541 and 542, and the circuit processor 599 may calculate a sum of the values of the outputs OUT1 and OUT2.

Operations of the sub-pixel 500 will now be described with reference to FIGS. 7 and 8.

The source electric voltage of the reset transistors Rx1 and Rx2 may be reset to the input power source voltage Vdd by applying a predetermined or reference voltage to the reset gates 581 and 582. When light is irradiated onto the photoelectric conversion region 530, the light may pass through a corresponding micro lens, and be filtered by a corresponding filter to have a predetermined or reference wavelength. The electron-hole pairs may be formed in the photoelectric conversion region 530, and electrons of the electron-hole pairs may be transferred to the first and second charge storage regions 521 and 522 via the n regions 551 and 552 that may be enlarged to the regions of the first and second transfer gates 541 and 542 to which the voltage is applied. When a voltage is applied to the transfer gates 571 and 572, the electric charges of the first and second charge storage regions 521 and 522 may be transferred to the floating diffusion regions 561 and 562. The electric charges of the floating diffusion regions 561 and 562 are shown as voltages of drive gates DG1 and DG2, and accordingly may be outputted to the outputs OUT1 and OUT2 by the selection gates SG1 and SG2 of the selection transistors Sx1 and Sx2. A distance to the object or a color image of the object may be measured by using the outputs OUT1 and OUT2. In the case of an infrared pixel, pulse voltages having a phase difference may be applied to the first and second transfer gates 541 and 542, and the circuit processor 599 may measure a distance to the object by using a time delay between the outputs OUT1 and OUT2.

In the case of each color pixel, the voltage may be simultaneously applied to the first and second transfer gates 541 and 542, and the circuit processor 599 may measure the intensity of a corresponding color by calculating a sum of the outputs OUT1 and OUT2. The voltages having a phase difference may be applied to the first and second transfer gates 541 and 542, and the circuit processor 599 may measure the intensity of a corresponding color by calculating a sum of the outputs OUT1 and OUT2.

Accordingly, a distance between an object and a color image sensor may be measured, and, thereby, the color image of the object may be realized three dimensionally.

Though the sub-pixel 500, according to example embodiments, may have a structure of the distance measuring sensor 100 of FIG. 1, example embodiments are not limited thereto. For example, the sub-pixel 500 may have the structure of the distance measuring sensor 200, 300, or 400 of FIG. 3, 4, or 5.

According to example embodiments, the color pixel may include a photodiode and a plurality of transistors, like, for example, those found in a conventional image sensor, instead of the double transfer gate structure described above.

Figure 9:
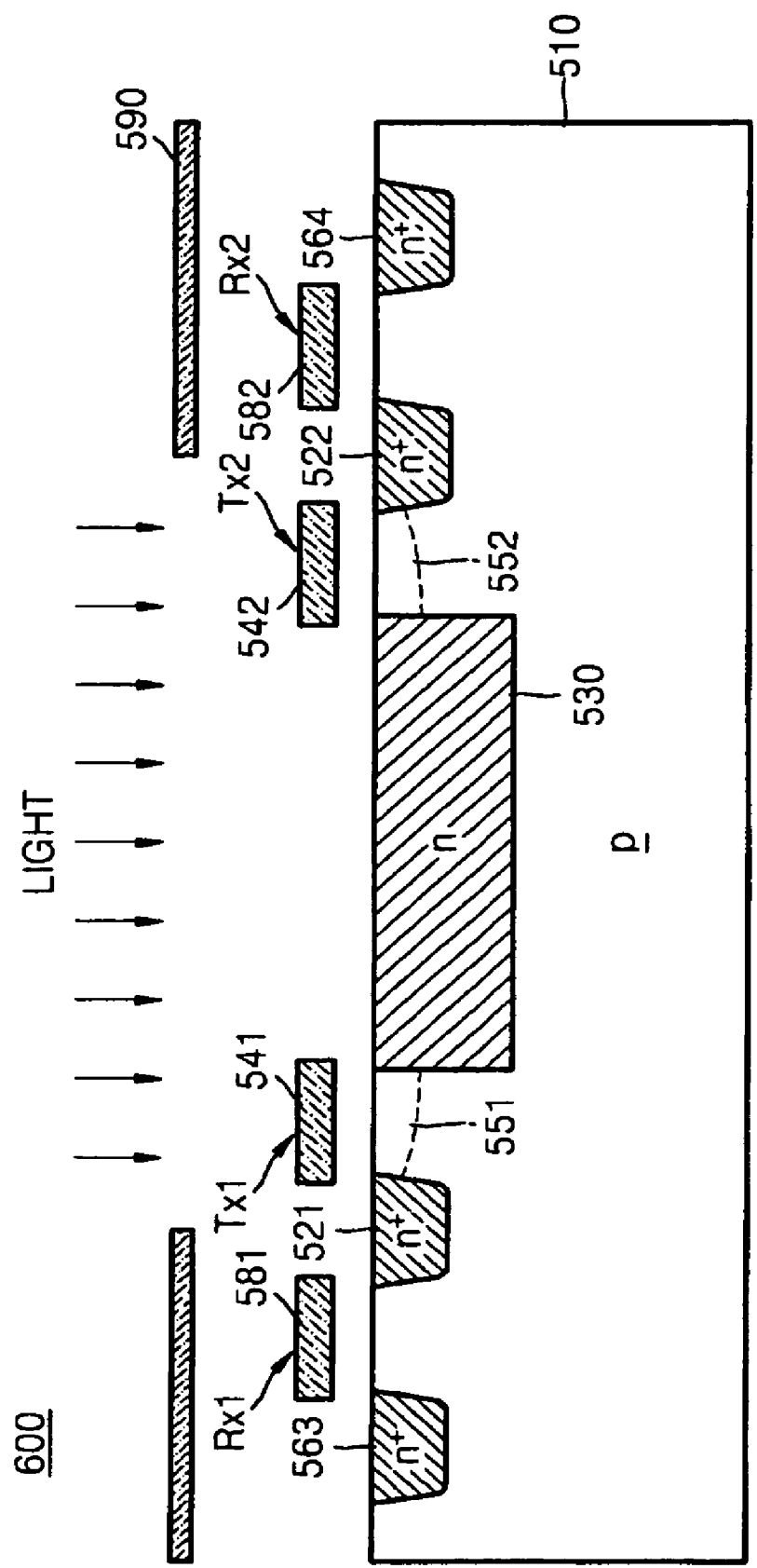
FIG. 9 is a diagram illustrating a sub-pixel of a unit pixel.
Figure 10:
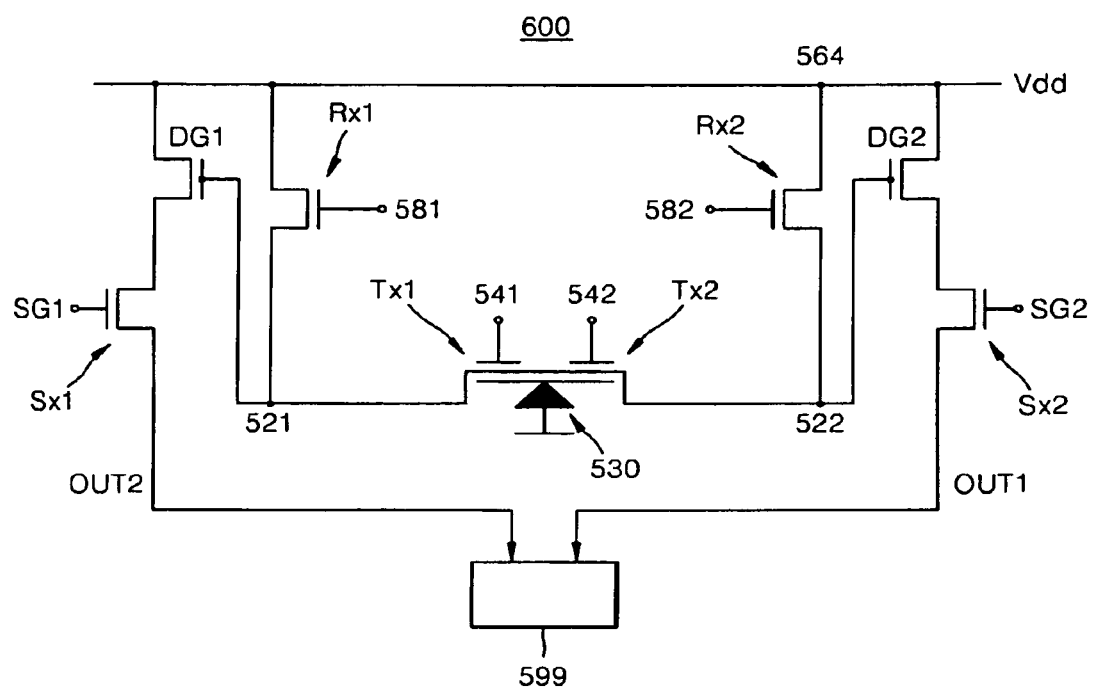
FIG. 10 is a circuit diagram of a sub-pixel of a three dimensional color image sensor, according to example embodiments.

FIG. 9 is a diagram illustrating a sub-pixel 600 of a unit pixel, and FIG. 10 is a circuit diagram of the sub-pixel 600 of a three dimensional color image sensor, according to example embodiments.

Referring to FIGS. 9 and 10, the sub-pixel 600 may be one of a red pixel, a green pixel, a blue pixel, and an infrared pixel. A filter (not shown) corresponding to each sub-pixel 600 may be formed on each sub-pixel 600, and a corresponding micro lens (not shown) may be formed on the filter. Elements of the sub-pixel 600 that are identical to the elements of the sub-pixel 500 of FIGS. 7 and 8 have the same reference numerals, but details thereof will be omitted here.

The sub-pixel 600 may include the first and second charge storage regions 521 and 522, which may be n+ doped regions, spaced apart from each other on the p-type substrate 510. The photoelectric conversion region 530 may be formed between the first and second charge storage regions 521 and 522. The photoelectric conversion region 530 may be an n-doped region or an intrinsic region.

The first and second transfer gates 541 and 542 may be formed above the p-type substrate 510, respectively between the photoelectric conversion region 530 and the first charge storage region 521, and between the photoelectric conversion region 530 and the second charge storage region 522. In other words, the double transfer gate may be formed in one sub-pixel region on the p-type substrate 510.

The photoelectric conversion region 530 may receive light and generate photo-charges.

The first and second charge storage regions 521 and 522 may accumulate electrons from electron-hole pairs formed in the photoelectric conversion region 530. When a voltage, for example a positive voltage of 2~3 V, is applied to the first and second transfer gates 541 and 542, the n regions 551 and 552 may be formed below the first and second transfer gates 541 and 542, and thus the electrons may be transferred and stored in the first and second charge storage regions 521 and 522 through the n regions 551 and 552. The first and second charge storage regions 521 and 522 may work as floating diffusion regions, and form the transfer transistors Tx1 and Tx2, together with the first and second transfer gates 541 and 542, and the photoelectric conversion region 530.

The reset diffusion regions 563 and 564, which may be n+ regions, may be formed on the p-type substrate 510 in a direction away from the first and second charge storage regions 521 and 522. The reset gates 581 and 582 may be formed respectively between the first charge storage region 521 and the reset diffusion region 563, and the second charge storage region 522 and the reset diffusion region 564. The first and second charge storage regions 521 and 522 (the floating diffusion regions), the reset diffusion regions 563 and 564, and reset gates 581 and 582 may form the reset transistors Rx1 and Rx2.

A three dimensional color image sensor having the sub-pixel 600 of FIGS. 9 and 10 may be more compact than the one having the sub-pixel 500 of FIGS. 7 and 8, since transfer gates 571 and 572 and n+ regions 561 and 562 may be omitted between the photoelectric conversion region 530 and the other transfer gates.

Operations of the sub-pixel 600 of FIGS. 9 and 10 may be known from operations in relation to FIGS. 7 and 8, and thus details thereof will be omitted here.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. An image sensor comprising:
   a photoelectric conversion region for generating photo-charges by receiving light, on a semiconductor substrate doped with a first impurity;
   a first charge storage region spaced apart from the photoelectric conversion region to one side of the photoelectric conversion region on the substrate, and a second charge storage region spaced apart from the photoelectric conversion region to another side of the photoelectric conversion region, wherein the first and second charge storage regions are each doped with a second impurity;
   a first reset diffusion region spaced apart from the first charge storage region away from the photoelectric conversion region on the substrate, and a second reset diffusion region spaced apart from the second storage region away from the photoelectric conversion region on the substrate, wherein the first and second reset diffusion regions are each doped with the second impurity;
   a first transfer gate formed between the photoelectric conversion region and the first charge storage region, and a second transfer gate formed between the photoelectric conversion region and the second charge storage region, above the substrate; and
   a first reset gate formed between the first charge storage region and the first reset diffusion region, and a second reset gate formed between the second charge storage region and the second reset diffusion region, above the substrate;
   wherein a predetermined voltage is applied to the first and second transfer gates such that the photo-charges of the photoelectric conversion region are selectively transferred to the first and second charge storage regions, and a predetermined voltage is applied to the first and second reset gates such that electric potential of the first and second charge storage regions are reset to input power source voltage.

2. The image sensor of claim 1, wherein the photoelectric conversion region is doped with the second impurity.

3. The image sensor of claim 2, wherein the photoelectric conversion region is doped with the second impurity having a lower concentration than the first and second charge storage regions.

4. The image sensor of claim 2, further comprising an intrinsic region below the photoelectric conversion region.

5. The image sensor of claim 1, wherein the photoelectric conversion region is an intrinsic region.

6. The image sensor of claim 1, wherein the photoelectric conversion region is formed at a predetermined depth from a top surface of the substrate.

7. The image sensor of claim 1, wherein the first and second transfer gates are formed of at least one of polysilicon or a metal.

8. The image sensor of claim 1, wherein both ends of the first and second transfer gates extend such that the ends of the first and second transfer gates face each other.

9. The image sensor of claim 1, wherein the first and second charge storage regions are floating diffusion regions, and the first and second charge storage regions form transfer transistors with the photoelectric conversion region and the first and second transfer gates, respectively.

10. The image sensor of claim 1, wherein the first and second reset diffusion regions form reset transistors with the photoelectric conversion region and the first and second reset gates, respectively.

11. The image sensor of claim 1, further comprising:
a light shield for preventing light from being irradiated on regions other than the photoelectric conversion region, above the substrate.

12. An image sensor, comprising:
first and second charge storage regions which are spaced apart from each other on a substrate doped with a first impurity, the first and second charge storage regions being doped with a second impurity;
a photoelectric conversion region which is formed between the first and second charge storage regions on the substrate; and
first and second transfer gates which are formed between the photoelectric conversion region and the first and second charge storage regions above the substrate to selectively transfer the photo-charges in the photoelectric conversion region to the first and second charge storage regions,
wherein the photoelectric conversion region generates photo-charges by receiving light being directly irradiated thereto.

13. The image sensor of claim 12, wherein the photoelectric conversion region is doped with the second impurity.

14. The image sensor of claim 13, wherein the photoelectric conversion region is doped with the second impurity having lower concentration than the first and second charge storage regions.

15. The image sensor of claim 13, further comprising:
an intrinsic region below the photoelectric conversion region.

16. The image sensor of claim 12, wherein the photoelectric conversion region is an intrinsic region.

17. The image sensor of claim 12, wherein the photoelectric conversion region is formed at a predetermined depth from a top surface of the substrate.

* * * * *